(12) United States Patent
Xue et al.

(10) Patent No.: US 9,852,902 B2
(45) Date of Patent: Dec. 26, 2017

(54) MATERIAL DEPOSITION FOR HIGH ASPECT RATIO STRUCTURES

(71) Applicant: Applied Materials, Inc., Santa Clara, CA (US)

(72) Inventors: Jun Xue, San Jose, CA (US); Ludovic Godet, Sunnyvale, CA (US); Martin A. Hilkene, Gilroy, CA (US); Matthew D. Scotney-Castle, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/506,536

(22) Filed: Oct. 3, 2014

(65) Prior Publication Data

US 2016/0099154 A1 Apr. 7, 2016

(51) Int. Cl.
   | | |
   |---|---|
   | *H01L 21/02* | (2006.01) |
   | *H01J 37/32* | (2006.01) |
   | *C23C 14/04* | (2006.01) |
   | *H01L 21/033* | (2006.01) |

(52) U.S. Cl.
   CPC ...... *H01L 21/02527* (2013.01); *C23C 14/046* (2013.01); *H01J 37/321* (2013.01); *H01J 37/32422* (2013.01); *H01L 21/0243* (2013.01); *H01L 21/02274* (2013.01); *H01L 21/02381* (2013.01); *H01L 21/02532* (2013.01); *H01L 21/02631* (2013.01); *H01L 21/02639* (2013.01); *H01L 21/033* (2013.01)

(58) Field of Classification Search
   CPC ... H01L 29/788; H01L 21/28; H01L 23/5227; H01L 23/645; H01L 29/1095; H01L 21/306; H01L 21/02527; H01L 21/02274; H01L 21/02381; H01L 21/0243; H01L 21/02532
   See application file for complete search history.

(56) References Cited

U.S. PATENT DOCUMENTS

| | | | | |
|---|---|---|---|---|
| 4,473,598 | A * | 9/1984 | Ephrath | ............... H01L 21/743 257/510 |
| 4,728,623 | A * | 3/1988 | Lu | .......... H01L 21/743 257/301 |
| 5,198,387 | A * | 3/1993 | Tang | ....... C23C 16/24 257/E21.101 |
| 6,495,294 | B1 * | 12/2002 | Yamauchi | ......... H01L 21/02381 257/E21.544 |
| 2002/0037627 | A1 * | 3/2002 | Liu | ................... H01L 21/76237 438/424 |
| 2006/0292719 | A1 * | 12/2006 | Lochtefeld | ........ H01L 21/02381 438/22 |
| 2007/0032092 | A1 * | 2/2007 | Shibata | ............ H01L 21/02381 438/758 |

(Continued)

*Primary Examiner* — Nathan W Ha
(74) *Attorney, Agent, or Firm* — Schwabe, Williamson & Wyatt, P.C.

(57) ABSTRACT

Ion species are supplied to a workpiece comprising a pattern layer over a substrate. A material layer is deposited on the pattern layer using an implantation process of the ion species. In one embodiment, the deposited material layer has an etch selectivity to the pattern layer. In one embodiment, a trench is formed on the pattern layer. The trench comprises a bottom and a sidewall. The material layer is deposited into the trench using the ion implantation process. The material layer is deposited on the bottom of the trench in a direction along the sidewall.

14 Claims, 7 Drawing Sheets

(56) References Cited

U.S. PATENT DOCUMENTS

| | | | | |
|---|---|---|---|---|
| 2007/0252195 A1* | 11/2007 | Yoshikawa | H01L 29/0696 | 257/329 |
| 2007/0275563 A1* | 11/2007 | Babich | H01L 21/26513 | 438/705 |
| 2008/0185647 A1* | 8/2008 | Wells | H01L 21/2015 | 257/347 |
| 2009/0085149 A1* | 4/2009 | Ishida | H01L 21/02381 | 257/499 |
| 2009/0108301 A1* | 4/2009 | Yin | H01L 21/02532 | 257/255 |
| 2010/0140698 A1* | 6/2010 | Roig-Guitart | H01L 29/0634 | 257/335 |
| 2011/0084308 A1* | 4/2011 | Loh | H01L 21/02381 | 257/190 |
| 2011/0101421 A1* | 5/2011 | Xu | H01L 21/02381 | 257/255 |
| 2011/0136288 A1* | 6/2011 | Duane | H01L 21/02381 | 438/59 |
| 2011/0316121 A1* | 12/2011 | Wang | H01L 21/26513 | 257/618 |
| 2012/0009787 A1* | 1/2012 | Kim | H01L 21/0334 | 438/674 |
| 2012/0276658 A1* | 11/2012 | Godet | H01L 21/30612 | 438/3 |
| 2012/0292684 A1* | 11/2012 | Dong | H01L 21/28273 | 257/316 |
| 2012/0315753 A1* | 12/2012 | Farooq | H01L 21/76898 | 438/653 |
| 2013/0020705 A1* | 1/2013 | Alptekin | H01L 21/26586 | 257/741 |
| 2013/0045562 A1* | 2/2013 | Liu | H01L 31/03529 | 438/72 |
| 2013/0109165 A1* | 5/2013 | Cho | H01L 29/66666 | 438/589 |
| 2014/0131770 A1* | 5/2014 | Chen | H01L 21/02381 | 257/192 |
| 2016/0126335 A1* | 5/2016 | Fogel | H01L 21/02587 | 438/429 |

* cited by examiner

MATERIAL DEPOSITION FOR HIGH ASPECT RATIO STRUCTURES

FIELD

Embodiments of the present invention pertain to the field of electronic device manufacturing, and in particular, to material deposition.

BACKGROUND

Decreasing the dimensions of electronic devices and increasing the level of their integration are two major trends in current electronic device manufacturing. As a result of these trends, the density of elements forming a semiconductor device continuously increases. The shrinkage of the semiconductor devices involves performing the routine fabrication of the semiconductor device elements on the sub-micron level.

Typically, an electronic device is fabricated on a wafer using many layers of films. Generally, layers of various semiconducting, conducting and insulating materials are used to form the integrated circuits. These layers may be doped, deposited and etched to form electronic devices. A layer of the electronic device may be fabricated using a mask that dictates the pattern of the layer.

Advanced patterning technologies are developed for photolithography to enhance the feature density. An example of the advanced patterning technologies is a multiple patterning process, where a lithography process is enhanced to increase the existing number of features. Typically, in the double patterning process spacers are formed on the sidewalls of a pre-patterned feature. The original pre-patterned feature is then removed. Because there are two spacers left for every feature, the feature density is doubled.

A carbon film is typically used as a sacrifice layer in the semiconductor process flow. Typically, the carbon film is deposited on the substrate by a blanket deposition technique. The carbon film is then etched to produce a pattern to etch the underlying substrate. The patterned carbon film can be used as a hard mask to transfer a pattern to the underlying substrate.

Current carbon film deposition techniques, however, have poor trench and via fill capability. Typically, the carbon film deposition techniques do not fill the bottom of the deep trench. The current carbon film deposition techniques result in clogging and voids in high aspect ratio trenches and vias. Additionally, current carbon film deposition techniques do not have deposition selectivity to silicon oxide. These shortcomings limit the use of the carbon films for many applications.

SUMMARY

Methods and apparatuses to deposit a material for high aspect ratio structures for electronic device manufacturing are described. Ion species are supplied to a workpiece comprising a pattern layer on a substrate. A material layer is deposited on the pattern layer using an implantation process of the ion species.

In one embodiment, ion species are supplied to a workpiece comprising a pattern layer on a substrate. A material layer is deposited on the pattern layer using an implantation process of the ion species. The deposited material layer has an etch selectivity to the pattern layer.

In one embodiment, a trench is formed on the pattern layer. The trench comprises a bottom and a sidewall. Ion species are supplied to a workpiece comprising a pattern layer on a substrate. A material layer is deposited on the pattern layer using an implantation process of the ion species. The material layer is deposited into the trench using the ion implantation process. The material layer is deposited on the bottom of the trench in a direction along the sidewall.

In one embodiment, a feature comprising a sidewall is formed on a pattern layer on a substrate. Ion species are supplied to the pattern layer. A material layer is deposited on the pattern layer using an implantation process of the ion species. The material layer is selectively deposited on the sidewall of the feature using the ion implantation process.

In one embodiment, ion species are supplied to a workpiece comprising a pattern layer on a substrate. A material layer is deposited on the pattern layer using an implantation process of the ion species. The ion species comprise carbon, silicon, germanium, or any combination thereof.

In one embodiment, ion species are supplied to a workpiece comprising a pattern layer on a substrate. A material layer is deposited on the pattern layer using an implantation process of the ion species. At least one of the energy and temperature of the ion species to control the depositing is adjusted.

In one embodiment, ion species are supplied to a workpiece comprising a pattern layer on a substrate. A material layer is deposited on the pattern layer using an implantation process of the ion species. The material layer is selectively deposited on the pattern layer while leaving a third material layer on the pattern layer exposed.

In one embodiment, ion species are supplied to a workpiece comprising a plurality of trenches between a plurality of features on an etch stop layer on a substrate. A material layer is deposited into the plurality of trenches using an implantation process of the ion species.

In one embodiment, ion species are supplied to a workpiece comprising a plurality of trenches between a plurality of features on an etch stop layer on a substrate. A material layer is deposited into the plurality of trenches using an implantation process of the ion species. A patterned mask layer is deposited on material layer. At least one of the features is selectively etched.

In one embodiment, ion species are supplied to a workpiece comprising a plurality of trenches between a plurality of features on an etch stop layer on a substrate. A material layer is deposited into the plurality of trenches using an implantation process of the ion species. At least one of the features comprises a core and a sidewall spacer adjacent to the core.

In one embodiment, ion species are supplied to a workpiece comprising a plurality of trenches between a plurality of features on an etch stop layer on a substrate. A material layer is deposited into the plurality of trenches using an implantation process of the ion species. At least one of the features comprises a fin structure. The material layer is selectively deposited on the at least one of the features.

In one embodiment, ion species are supplied to a workpiece comprising a plurality of trenches between a plurality of features on an etch stop layer on a substrate. A material layer is deposited into the plurality of trenches using an implantation process of the ion species. The material layer has an etch selectivity to at least one of the plurality of features.

In one embodiment, ion species are supplied to a workpiece comprising a plurality of trenches between a plurality of features on an etch stop layer on a substrate. A material layer is deposited into the plurality of trenches using an implantation process of the ion species. The ion species comprise carbon, silicon, germanium, or any combination thereof.

In one embodiment, ion species are supplied to a workpiece comprising a plurality of trenches between a plurality of features on an etch stop layer on a substrate. A material layer is deposited into the plurality of trenches using an implantation process of the ion species. At least one of energy and a temperature of the ion species is adjusted to control the depositing.

In one embodiment, an apparatus to manufacture an electronic device comprises a processing chamber comprising a pedestal to hold a workpiece comprising a substrate. An ion source is coupled to the processing chamber to supply ion species to the pattern layer. A processor is coupled to the ion source. The processor has a first configuration to control depositing a material layer on the pattern layer using an implantation process of the ion species.

In one embodiment, an apparatus to manufacture an electronic device comprises a processing chamber comprising a pedestal to hold a workpiece comprising a pattern layer over a substrate. An ion source is coupled to the processing chamber to supply ion species to the pattern layer. A processor is coupled to the ion source. The processor has a first configuration to control depositing a material layer on the pattern layer using an implantation process of the ion species. The material layer has an etch selectivity to the pattern layer.

In one embodiment, an apparatus to manufacture an electronic device comprises a processing chamber comprising a pedestal to hold a workpiece comprising a pattern layer over a substrate. An ion source is coupled to the processing chamber to supply ion species to the pattern layer. A processor is coupled to the ion source. The processor has a first configuration to control depositing a material layer on the pattern layer using an implantation process of the ion species. The processor has a second configuration to control forming a trench on the pattern layer. The trench comprises a bottom and a sidewall. The processor has a third configuration to control depositing the material layer into the trench using the ion implantation process. The material layer is deposited on the bottom of the trench in a direction along the sidewall.

In one embodiment, an apparatus to manufacture an electronic device comprises a processing chamber comprising a pedestal to hold a workpiece comprising a pattern layer over a substrate. The pattern layer comprises a feature. An ion source is coupled to the processing chamber to supply ion species to the pattern layer. A processor is coupled to the ion source. The processor has a first configuration to control depositing a material layer on the pattern layer using an implantation process of the ion species. The processor has a fourth configuration to control selective deposition of the material layer on a sidewall of the feature using the ion implantation process.

In one embodiment, an apparatus to manufacture an electronic device comprises a processing chamber comprising a pedestal to hold a workpiece comprising a pattern layer over a substrate. An ion source is coupled to the processing chamber to supply ion species to the pattern layer. A processor is coupled to the ion source. The processor has a first configuration to control depositing a material layer on the pattern layer using an implantation process of the ion species. The ion species comprise carbon, silicon, germanium, or any combination thereof.

In one embodiment, an apparatus to manufacture an electronic device comprises a processing chamber comprising a pedestal to hold a workpiece comprising a pattern layer over a substrate. An ion source is coupled to the processing chamber to supply ion species to the pattern layer. A processor is coupled to the ion source. The processor has a first configuration to control depositing a material layer on the pattern layer using an implantation process of the ion species. The processor has a fifth configuration to control adjusting at least one of an energy and a temperature of the ion species to control the depositing.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1A:
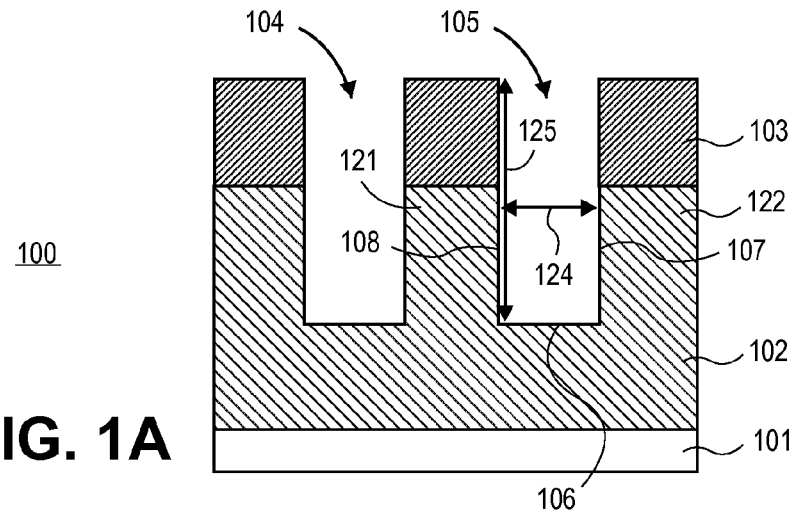
FIG. 1A shows a side view of a workpiece to manufacture an electronic device according to one embodiment of the invention.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to deposit a material for high aspect ratio structures for electronic device manufacturing are described. Ion species are supplied to a workpiece comprising a pattern layer on a substrate. In an embodiment, a material layer is directionally deposited on the pattern layer using an implantation process of the ion species. Unlike with the current deposition techniques, directional deposition of the material using an implantation process of the ion species provides an advantage of filling in very deep trenches and vias while avoiding clogging and voids formation. Furthermore, the material layer directionally deposited by an implantation process of ion species advantageously has deposition selectivity. Additionally, the material layer deposited using an implantation process of the ion species advantageously has an etch selectivity to the underlying substrate. Methods and apparatuses to deposit a material layer using an implantation process of the ion species as described herein can be used in an advanced pattern process scheme to simplify process operation and to relax lithography overlay requirements, as described in further detail below.

FIG. 1A shows a side view of a workpiece 100 to manufacture an electronic device according to one embodiment of the invention. Workpiece 100 comprises a substrate 101. In an embodiment, substrate 101 comprises a semiconductor material, e.g., silicon ("Si"), germanium ("Ge"), silicon germanium ("SiGe"), a III-V material based material, or any combination thereof. In one embodiment, substrate 101 includes metallization interconnect layers for integrated circuits. In one embodiment, substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 101 includes interconnects, for example, vias, configured to connect the metallization layers. In one embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In an embodiment, substrate 101 comprises an etch stop layer.

A pattern layer 102 is deposited on substrate 101. Pattern layer 102 comprises a plurality of features—e.g., a feature 121 and a feature 122—separated by a plurality of trenches—e.g., a trench 104 and a trench 105. Trench 105 has a bottom portion 106 and opposing sidewalls 107 and 108. As shown in FIG. 1A, sidewall 108 is a sidewall of the feature 121, and sidewall 107 is a sidewall of the feature 122. Each of the trenches 104 and 105 has a substantially high aspect ratio. Generally, the aspect ratio of a structure—e.g., via, trench, or other structure—refers to the ratio between a greater size of the structure in one dimension (e.g., depth) to a smaller size of the structure in another dimension (e.g., width). In one embodiment, the aspect ratio of each of the trenches 104 and 105 is at least 5:1. In more specific embodiment, the aspect ratio of each of the trenches 104 and 105 is at least 10:1.

In an embodiment, a depth 125 of the trench 105 is in an approximate range from about 30 nm to about 500 nm (μm). In one embodiment, a width 124 of the trench 105 is at least 5 nm. In an embodiment, the width 124 is from about 2 nm to about 100 nm. In more specific embodiment, the width 124 is from about 5 nm to about 20 nm.

In an embodiment, the pattern layer 102 is an align key pattern layer, and features 121 and 122 are silicon line structures.

In an embodiment, at least one of the features 121 and 122 is a fin structure to form an electronic device. In an embodiment, at least one of the trenches 104 and 105 is via. In an embodiment, the pattern layer 102 is a stack of one or more layers. In an embodiment, the features of the pattern layer 102 are features of electronic devices, e.g., transistors, memories, capacitors, resistors, optoelectronic devices, switches, and any other active and passive electronic devices.

In one embodiment, the pattern layer 102 comprises one or more semiconductor material layers, e.g., Si, Ge, SiGe, a III-V material based material layer, e.g., GaAs, InSb, GaP, GaSb based materials, carbon nanotubes based materials, or any combination thereof. In more specific embodiment, the material of the pattern layer 102 is silicon.

In another embodiment, pattern layer 102 comprises an insulating layer, e.g., an oxide layer, such as silicon oxide, aluminum oxide ("Al2O3"), silicon oxide nitride ("SiON"), a silicon nitride layer, other electrically insulating layer determined by an electronic device design, or any combination thereof. In one embodiment, the pattern layer 102 comprises polyimide, epoxy, photodefinable materials, such as benzocyclobutene (BCB), and WPR-series materials, or spin-on-glass.

In yet another embodiment, the pattern layer 102 comprises a conductive layer. In an embodiment, the features of the pattern layer 102 comprise a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof.

In an embodiment, pattern layer 102 is deposited on substrate 101 using one or more deposition techniques, such as but not limited to a chemical vapor deposition ("CVD"), e.g., a Plasma Enhanced Chemical Vapor Deposition ("PECVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

As shown in FIG. 1A, a patterned hard mask layer 103 is deposited on top portions of the features of the pattern layer 102. The patterned hard mask layer 103 covers top portions, such as a top portion 113 of each of the features of the pattern layer 102. The patterned hard mask layer 103 is patterned and etched using one or more patterning and etching techniques known to one of ordinary skill in the art of electronic device manufacturing. In an embodiment, the pattern layer 102 is etched through the openings in the patterned hard mask layer 103 to form trenches 104 and 105. The pattern layer 102 can be etched using one of etching techniques (e.g., a plasma etching technique, or other etching technique) known to one of ordinary skill in the art of electronic device manufacturing.

In one embodiment, the patterned hard mask layer 103 is an oxide layer, e.g., a silicon oxide layer, a boron oxide layer, other hard mask layer, or any combination thereof. In another embodiment, the patterned hard mask layer 103 is a nitride layer, e.g., silicon nitride, titanium nitride, silicon oxide nitride, other hard mask layer, or any combination thereof.

In an embodiment, the patterned hard mask layer 103 comprises an organic hard mask. In an embodiment, the patterned hard mask layer 103 comprises an amorphous carbon layer doped with a chemical element (e.g., boron, silicon, aluminum, gallium, indium, or other chemical element). In an embodiment, patterned hard mask layer 103 comprises a boron doped amorphous carbon layer ("BACL"). In an embodiment, patterned hard mask layer 103 comprises an aluminum oxide; polysilicon, amorphous Silicon, poly germanium ("Ge"), a refractory metal—e.g., tungsten ("W"), molybdenum ("Mo"), other refractory metal,—or any combination thereof.

Figure 1B:
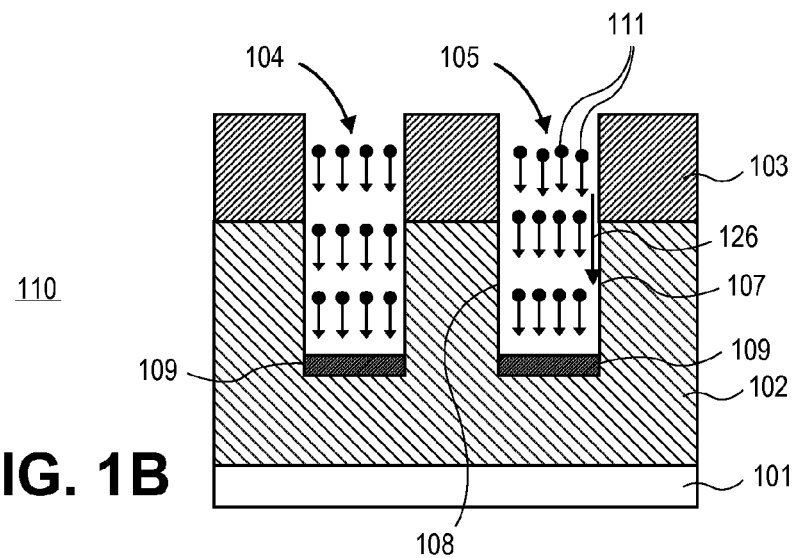
FIG. 1B is a view similar to FIG. 1A illustrating supplying ion species to a workpiece to deposit a material layer according to one embodiment of the invention.

FIG. 1B is a view 110 similar to FIG. 1A illustrating supplying ion species to a workpiece to deposit a material layer according to one embodiment of the invention. As shown in FIG. 1B, ion species 111 are supplied to the workpiece using an implantation process. The bottom portions 106 of the trenches 104 and 105 are subjected to a treatment by the ion species. In an embodiment, the ion species 111 comprise ionized atoms, ionized molecules, clusters of ions, other ionized particles, or any combination thereof. In an embodiment, the ion species 111 comprise carbon, silicon, germanium, or any combination thereof.

As shown in FIG. 1B, a material layer 109 is deposited into the trenches 104 and 105 by using the implantation process of the ion species 111. In one embodiment, the species 111 are implanted to modify the bottom portions 106 of the trenches 104 and 105, so that the material layer 109 is formed. In one embodiment, the ion species 111 attach to the bottom portions 106 of the trenches to form the material layer 109. As shown in FIG. 1B, the material layer 109 is directionally deposited on the bottom of the trench 105 along an axis 126 that is substantially parallel to sidewall 107. In an embodiment, the material layer 109 is different from that of the pattern layer 102. In an embodiment, the material layer 109 has an etch selectivity to the underlying pattern layer 102. That is, the etching rate of the material layer 109 is other than the etching rate of the underlying pattern layer 102. In an embodiment, energy of the ion species, temperature of the ion species, or both are adjusted to control depositing the layer 109. In an embodiment, a dose of the ion species, a mass of the ion species, or both are adjusted to control depositing the layer 109. As shown in FIG. 1B, the material layer 109 is deposited in the trenches 104 and 105 from the bottom up.

In an embodiment, the workpiece is placed on a pedestal in an implant chamber of an implant system. In an embodiment, the temperature of the pedestal is less than 400 degrees C. to comply with a back end of line (BEOL) processing requirement. In more specific embodiment, the pedestal temperature is less than 100 degrees C. In yet more specific embodiment, the pedestal temperature is in an approximate range from about 25 degrees C. to about 100 degrees C.

The accelerated ion species 111 comprising ionized atoms, ionized molecules, clusters of ions, other ionized particles, or any combination thereof are extracted from plasma generated from a gas supplied to the implant chamber. Generally, the plasma comprises plasma particles, for example, ions, electrons, radicals, or any combination thereof. Ion species 111 are accelerated by an electric field generated in the implant chamber.

In an embodiment, the accelerated ion species 111 are extracted from the plasma by applying a high DC power supply voltage to a pedestal having the workpiece thereon. The accelerated ion species 111 are targeted to be deposited into the bottom portions of the trenches 104 and 105.

In an embodiment, a gas to generate plasma to extract ion species for depositing the layer 109 of carbon comprises a fluorocarbon gas (e.g., CF4). In another embodiment, the material layer 109 of silicon is deposited using ion species extracted from plasma generated from a gas comprising silane. In an embodiment, the ion species chemically attach to the bottom portions of the trenches 104 and 105 to form material layer 109. In an embodiment, the carbon ion species 111 are implanted into the silicon bottom portions 106 of the pattern layer 102 to form layer 109 of carbon on pattern layer 102.

Figure 6:
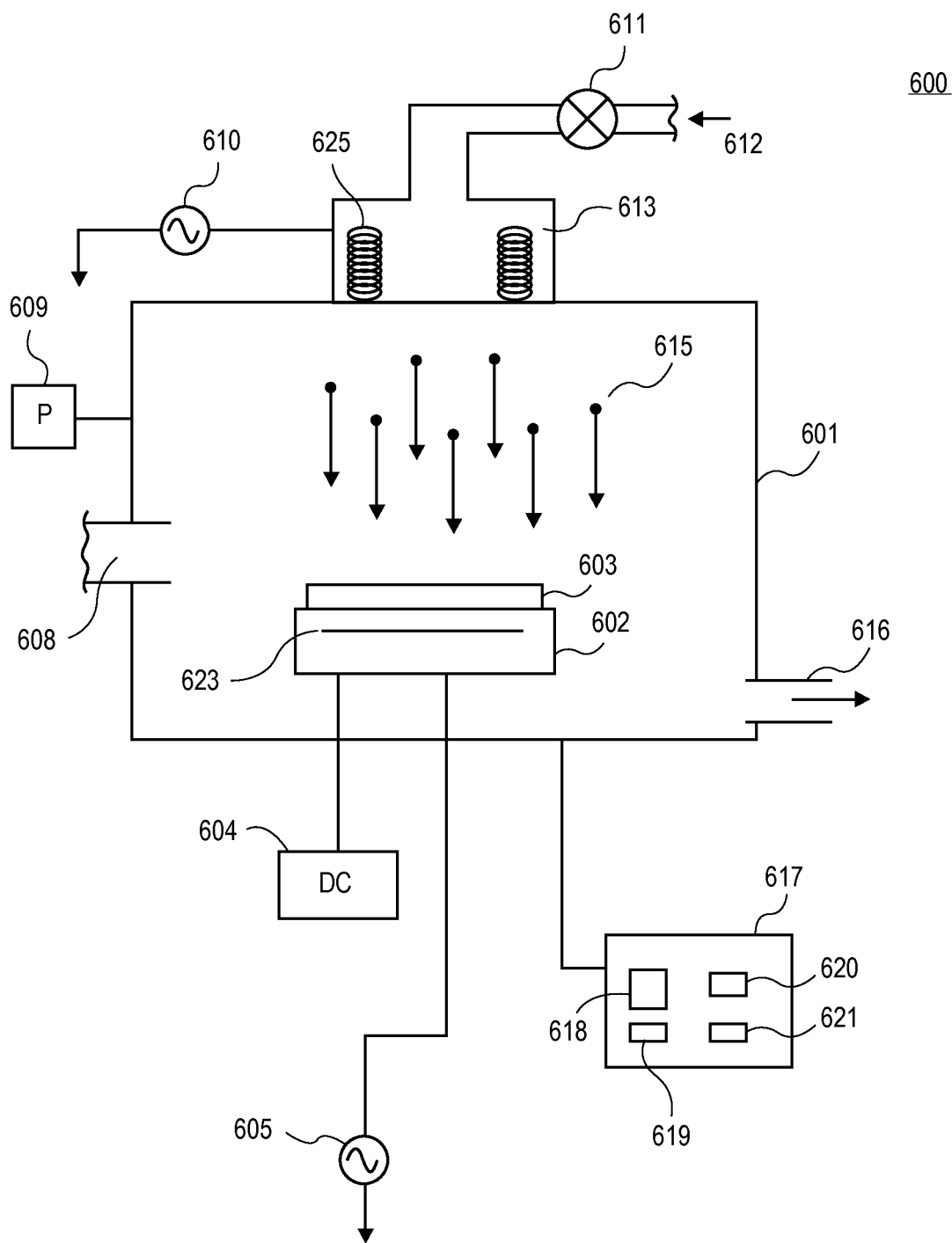
FIG. 6 shows a block diagram of one embodiment of a processing system to deposit a material layer by an ion implantation according to one embodiment of the invention.

In an embodiment, the implant system can be for example one depicted in FIG. 6 or any other implant system. In an embodiment, the implant system has an inductively coupled plasma (ICP) source coupled to the implant chamber. One or more parameters of the implant system to deposit the material layer 109—e.g., a pressure provided to the implant chamber, a plasma source power, a bias power, a process gas flow, a process gas chemistry, a temperature, implantation time, or any combination thereof—are adjusted to deposit the material layer 109. In an embodiment, the implant chamber pressure is in an approximate range from about 4 mT to about 10 mT. In an embodiment, the plasma is generated with RF source power in an approximate range from about 400 W to about 2000 W. The RF source power is adjusted to control the rate of the deposition. In an embodiment, the RF bias power having peak-to-peak voltage Vp-p in an approximate range from about 500V to about 1500V is used to extract the accelerated ion species from the plasma. The Vp-p determines the peak-to-peak energy of the ion species implanted to the pattern layer 102 on substrate 101. In an embodiment, the deposition time is adjusted based on the design (e.g., the depth of the trench, height of the feature, other feature design).

Figure 1C:
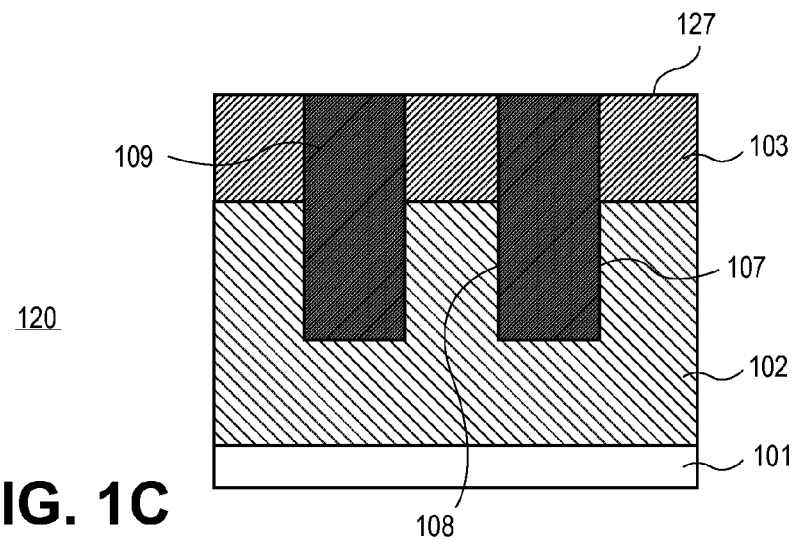
FIG. 1C is a view similar to FIG. 1B after the material layer is deposited according to one embodiment of the invention.

FIG. 1C is a view 120 similar to FIG. 1B after the material layer 109 is deposited according to one embodiment of the invention. As shown in FIG. 1C, the material layer 109 fills in trenches 104 and 105 from the bottom portions 106 up within the trenches without clogging and voids formation. In an embodiment, the material layer 109 has deposition selectivity to the hard mask layer 103. As shown in FIG. 1C, the material layer 109 is not grown on the top portions of the patterned hard mask layer 103, such as a top portion 127, so that the top portions of the hard mask layer 103 remain exposed. In an embodiment, the material layer 109 comprises a carbon layer, a silicon layer, a germanium layer, other material layer, or any combination thereof. In another embodiment, the material layer comprises a titanium oxide layer, a titanium nitride layer, an aluminum oxide layer, an aluminum nitride layer, other material layer, any combination thereof.

In a non-limiting example, the material layer 109 is a carbon layer deposited by implantation of carbon ions, and the pattern layer 102 is a silicon layer (e.g., silicon, silicon oxide, silicon nitride, or any combination thereof). In another non-limiting example, the material layer 109 is a carbon layer deposited by implantation of carbon ions, and the pattern layer 102 is a germanium layer (e.g., germanium, germanium oxide, germanium nitride, or any combination thereof). In another non-limiting example, the material layer 109 is a silicon layer deposited by implantation of silicon ions, and the pattern layer 102 is a silicon nitride layer. In yet another non-limiting example, the material layer 109 is a silicon layer deposited by implantation of silicon ions, and the pattern layer 102 is a silicon oxide layer. In yet another non-limiting example, the material layer 109 is a germanium deposited by implantation of germanium ion and the pattern layer 102 is a germanium nitride layer. In yet another non-limiting example, the material layer 109 is germanium deposited by implantation of germanium ions, and the pattern layer 102 is a germanium oxide layer.

Figure 2A:
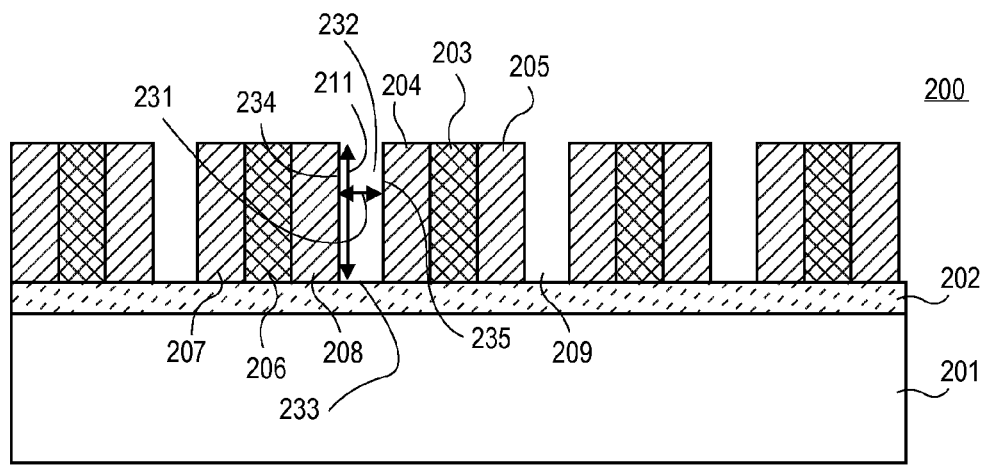
FIG. 2A is a side view of a workpiece to manufacture an electronic device according to another embodiment of the invention.

FIG. 2A is a side view of a workpiece 200 to manufacture an electronic device according to another embodiment of the invention. Workpiece 200 comprises a substrate 201. The substrate 201 is represented by substrate 101. An etch stop layer 202 is deposited on substrate 201. In one embodiment, the etch stop layer 202 comprises an insulating layer, e.g., an oxide layer, such as titanium oxide (TiO2), titanium nitride (TiN), silicon oxide, aluminum oxide ("Al2O3"), silicon oxide nitride ("SiON"), a silicon nitride layer, other electrically insulating layer determined by an electronic device design, or any combination thereof. In one embodiment, the etch stop layer 202 comprises polyimide, epoxy, photodefinable materials, such as benzocyclobutene (BCB), and WPR-series materials, or spin-on-glass.

The etch stop layer 202 can be deposited on substrate 201 using one or more deposition techniques, such as but not limited to a chemical vapor deposition ("CVD"), e.g., a Plasma Enhanced Chemical Vapor Deposition ("PECVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

A patterned hard mask layer 203 comprising a plurality of features—e.g., core features 203 and 206—is deposited on etch stop layer 202. As shown in FIG. 2A, sidewall spacer features—e.g., sidewall spacer feature 204 205 and sidewall spacer features 207 and 208—are formed on opposing sidewalls of each of the core features. The core features having sidewall spacer features thereon are separated by trenches, such as a trench 209 and a trench 211, as shown in FIG. 2A.

Trench 211 has a bottom portion 233 and opposing sidewalls 234 and 235. Bottom portion 233 is the exposed portion of the etch stop layer 202 between the sidewall spacer feature 204 and the sidewall spacer feature 208. The sidewall 234 is the sidewall of the sidewall spacer feature 209 and sidewall 235 is the sidewall of the sidewall spacer feature 204.

The material of the sidewall spacers is different from the material of the core features. In an embodiment, each of the core features comprises a semiconductor material, e.g., silicon, germanium, SiGe, a III-V material based material, or other semiconductor material. In an embodiment, each of the sidewall spacer features comprises a dielectric material, e.g., silicon oxide, silicon nitride, silicon carbide, silicon oxide nitride, or any other spacer material known to one of ordinary skill in the art of electronic device manufacturing. In another embodiment, each of the sidewall spacer features and core features comprises a dielectric material, e.g., silicon oxide, silicon nitride, silicon carbide, silicon oxide nitride, or any other dielectric material known to one of ordinary skill in the art of electronic device manufacturing. In more specific embodiment, the core feature comprises silicon, and the sidewall spacer features deposited thereon comprise silicon nitride, silicon oxide, or any combination thereof. In another more specific embodiment, the core feature comprises silicon oxide, the sidewall spacer features deposited thereon comprise silicon nitride. In another more specific embodiment, the core feature comprises silicon nitride and the sidewall space features deposited thereon comprise silicon oxide. The sidewall spacer features can be formed by depositing a spacer layer (not shown) on the core features—e.g., core features 203 and 206—and then etching the spacer layer, as known one of ordinary skill in the art of electronic device manufacturing.

In an embodiment, each of the trenches 209 and 211 has a substantially high aspect ratio. In one embodiment, the aspect ratio of each of the trenches 209 and 211 is at least 5:1. In more specific embodiment, the aspect ratio of each of the trenches 209 and 211 is at least 10:1.

In an embodiment, a depth 232 of the trench is in an approximate range from about 30 nm to about 500 nm (µm). In one embodiment, a width 231 of the trench is at least 5 nm. In an embodiment, the width 231 is from about 2 nm to about 100 nm. In more specific embodiment, the width 231 is from about 5 nm to about 20 nm.

Figure 2B:
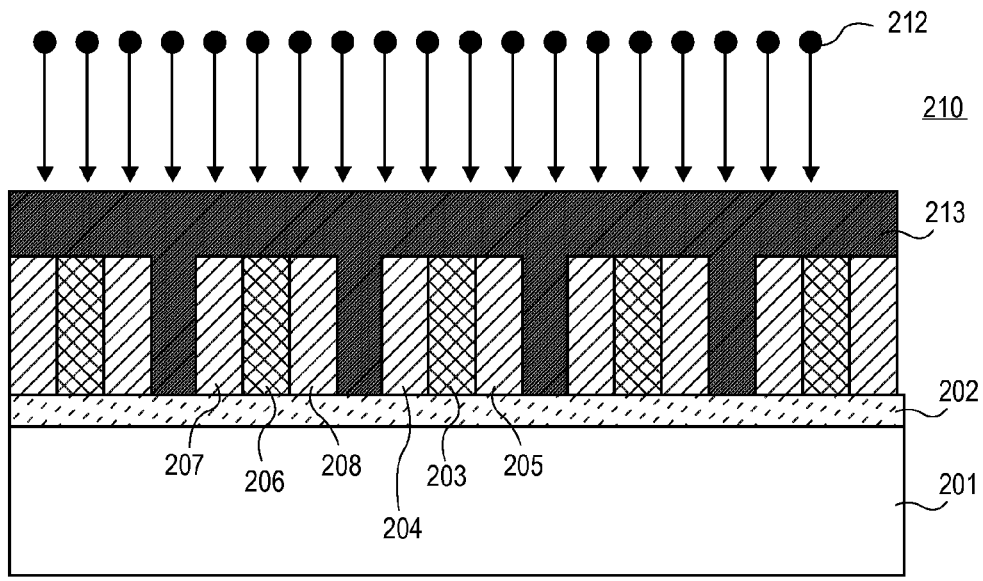
FIG. 2B is a view similar to FIG. 2A illustrating depositing a material layer by implanting ion species of the material according to another embodiment of the invention.

FIG. 2B is a view 210 similar to FIG. 2A illustrating depositing a material layer by implanting ion species of the material according to another embodiment of the invention. As shown in FIG. 1B, ion species 212 are supplied to the workpiece using an implantation process. As shown in FIG. 2B, the bottom portions of the trenches 209 and 211 and top portions of the features—e.g., features 203, 204, 205, 206, 207 and 208—are subjected to a treatment by the ion species. In an embodiment, the ion species 212 are represented by ion species 111. In one embodiment, the ion species 212 comprise carbon, silicon, germanium, or any combination thereof.

As shown in FIG. 2B, a material layer 213 is directionally deposited into the trenches 209 and 211 and onto the top portions of the features 203, 204, 205, 206, 207 and 208 by using the implantation process of the ion species 212. In one embodiment, the species 212 are implanted to modify the bottom portions of the trenches 209 and 211 and top portions of the features 203, 204, 205, 206, 207 and 208, so that the material layer 213 is formed. As shown in FIG. 2B, the directionally deposited material layer 213 fills in trenches 209 and 211 from the bottom portions up along the trench sidewalls while avoiding clogging and voids formation. In one embodiment, the ion species 212 attach to the bottom portions of the trenches 209 and 211 and top portions of the features 203, 204, 205, 206, 207 and 208 to form the material layer 109. In an embodiment, the material layer 213 is different from that of the material of the features and the etch stop layer.

In an embodiment, the material layer 213 comprises a carbon layer, a silicon layer, a germanium layer, other material layer, or any combination thereof. In another embodiment, the material layer comprises a titanium oxide layer, a titanium nitride layer, an aluminum oxide layer, an aluminum nitride layer, or any combination thereof. In a more specific embodiment, the material layer 213 is a carbon layer deposited by implantation of carbon ions. In a more specific embodiment, the core features—e.g., core features 203 and 206—are silicon features, the sidewall spacer features—e.g., sidewall spacer features 204, 205, 207 and 208—are silicon nitride, silicon oxide, or any combination thereof, and the material layer 213 is a carbon layer. In another more specific embodiment, the core features—e.g., core features 203 and 206—are silicon features, the sidewall spacer features—e.g., sidewall spacer features 204, 205, 207 and 208—are silicon oxide features, and the material layer 213 is a carbon layer. In yet another more specific embodiment, the core features—e.g., core features 203 and 206—are silicon features, the sidewall space features—e.g., sidewall spacer features 204, 205, 207 and 208—are silicon nitride features, and the material layer 213 is a carbon layer. In an embodiment, the material layer 213 has the etch selectivity to the underlying layers, as described above.

In an embodiment, energy of the ion species, temperature of the ion species, or both are adjusted to control depositing the layer 213, as described above with respect to ion species 111. In an embodiment, a dose of the ion species, a mass of the ion species, or both are adjusted to control depositing the layer 213, as described above with respect to ion species 111. As shown in FIG. 2B, the material layer 213 is deposited in the trenches 209 and 211 from the bottom up so that formation of voids and clogging is avoided, as described above.

Figure 2C:
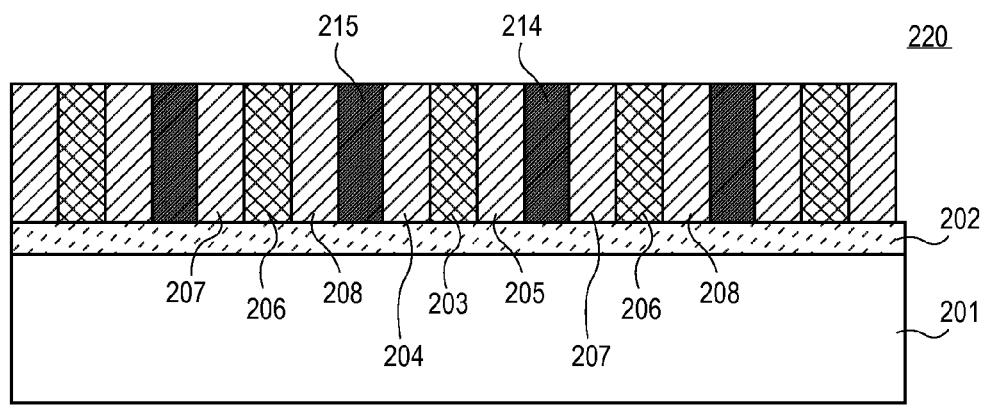
FIG. 2C is a view similar to FIG. 2C after the material layer is removed from the top portions of the features according to another embodiment of the invention.

FIG. 2C is a view 220 similar to FIG. 2C after the material layer 213 is removed from the top portions of the features according to another embodiment of the invention. As shown in FIG. 2C, the top surfaces of the portions 214 and 215 of the material layer 213 within trenches 209 and 211 are substantially evened out with the top surfaces of the core features 203 and 206 and the sidewall space features 204, 205, 207 and 208. In an embodiment, the portions of the material layer 213 are removed from the top portions of the core features and from the top portions of the sidewall spacer features using one or more of the etching and chemical-mechanical polishing (CMP) techniques known to one of ordinary skill in the art of electronic device manufacturing.

Figure 2D:
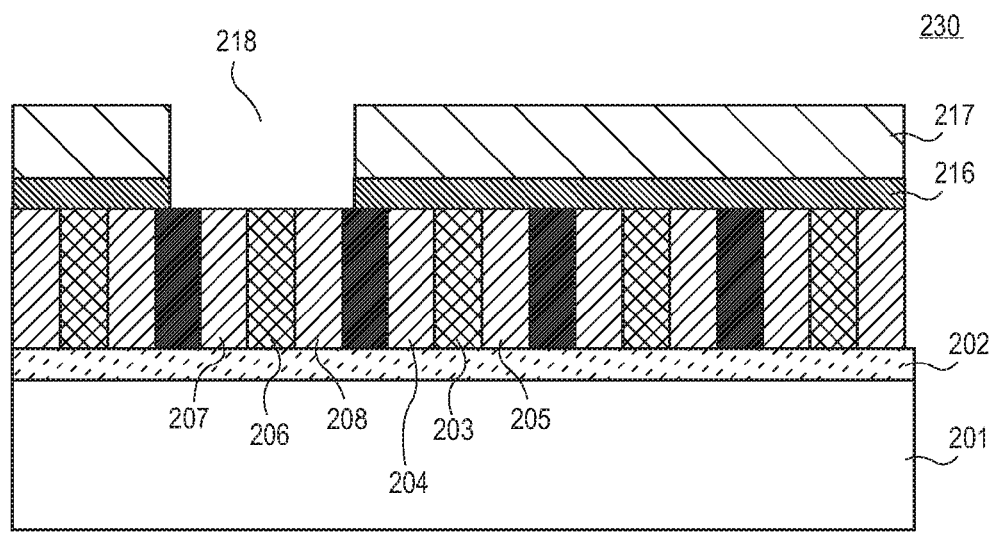
FIG. 2D is a view similar to FIG. 2C after a patterned mask layer is formed on the features and on the material layer according to another embodiment of the invention.

FIG. 2D is a view similar to FIG. 2C after a patterned mask layer is formed on the features and on the material layer according to another embodiment of the invention. The patterned mask layer comprises a photoresist layer 217 on a hard mask layer 216 deposited on the top portions of the sidewall spacer features 204, 205, 207 and 208 and core features 203 and 206 and the top portions of the material layer 214 and 215. An opening 218 formed through the photoresist layer 217 and the hard mask layer 216 to expose the top portions of the sidewall spacers features 207 and 208 and the core feature 206.

In an embodiment, the hard mask layer 216 comprises an organic hard mask. In an embodiment, the hard mask layer 216 comprises an amorphous carbon layer doped with a chemical element (e.g., boron, silicon, aluminum, gallium, indium, or other chemical element). In an embodiment, hard mask layer 216 comprises a boron doped amorphous carbon layer ("BACL"). In an embodiment, hard mask layer 216 comprises an aluminum oxide (e.g., $Al_2O_3$); polysilicon, amorphous Silicon, poly germanium ("Ge"), a refractory metal (e.g., tungsten ("W"), molybdenum ("Mo"), other refractory metal, or any combination thereof.

Figure 2E:
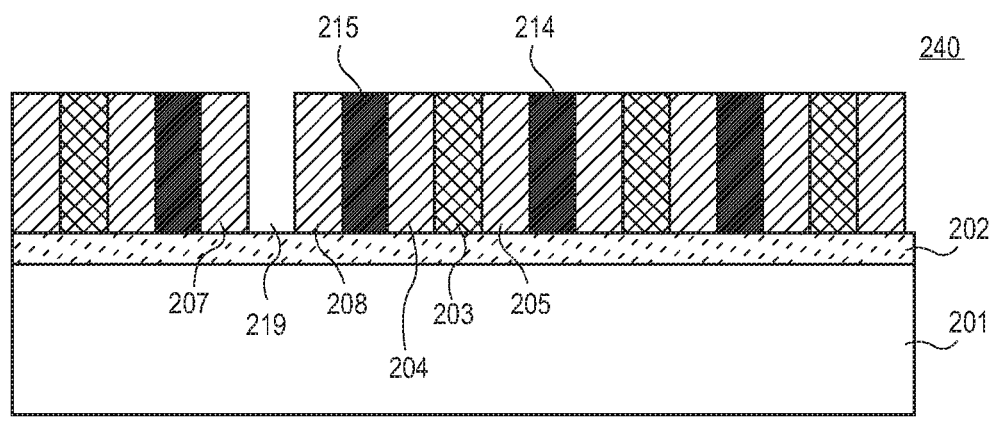
FIG. 2E is a view similar to FIG. 2D after a core feature, the photoresist layer and the hard mask layer are removed according to one embodiment of the invention.

FIG. 2E is a view 250 similar to FIG. 2D after a core feature, the photoresist layer 217 and the hard mask layer 216 are removed according to one embodiment of the invention. Feature 206 is removed by selective etching. The feature 206 is selectively etched through opening 218 to expose a portion 219 of the etch stop layer 202. Sidewall spacer features 207 and 208 are left intact by etching. In an embodiment, the core feature 206 is selectively removed using one of plasma etching techniques, or other dry etching techniques known to one of ordinary skill in the art of electronic device manufacturing. In an embodiment, the photoresist layer and the hard mask layer are removed using one or more of the etching and CMP techniques known to one of ordinary skill in the art of electronic device manufacturing.

Figure 2F:
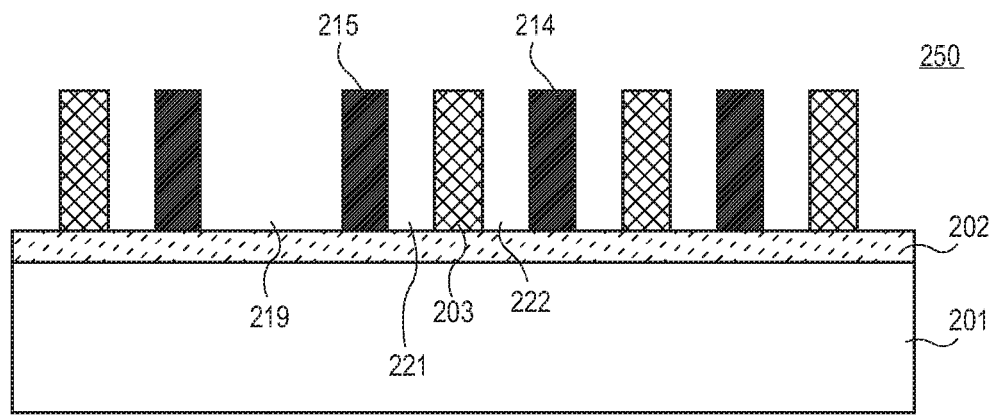
FIG. 2F is a view similar to FIG. 2E after the sidewall spacers are removed according to another embodiment of the invention.

FIG. 2F is a view 250 similar to FIG. 2E after the sidewall spacers are removed according to another embodiment of the invention. The sidewall spacer features 204, 205, 207 and 208 are selectively etched to expose portions of the etch stop layer 202. Portions of the material layer 214 and 215 and core features—e.g., core feature 203—are left intact by the selective etching. Using the material layer deposited by implantation of the ion species for different pitch patterning scheme relaxes the photoresist alignment requirement, so that the size of the opening 218 in the photoresist layer 217 and hard mask layer 216 can be greater than the size of the removed feature, as shown in FIGS. 2E and 2F. As the sizes of the electronic device features decrease, forming a patterned hard mask layer comprising the carbon layer deposited by the carbon ion implantation into the trenches between core and sidewall spacer features provides an advantage over the current patterning techniques. According to methods described herein, different materials with different pitches can be selectively etched to obtain patterns without the need for stringent overlay requirement.

In an embodiment, the sidewall spacer features are removed using one of plasma etching techniques, or other dry etching techniques known to one of ordinary skill in the art of electronic device manufacturing.

In one embodiment, each of the core feature, sidewall spacer feature and the portion of the material deposited by ion implantation is selectively plasma etched using an appropriate plasma chemistry that selectively etches that feature. For example, the silicon etch plasma may be formed using a gas selected from the group consisting of HBr, $Cl_2$ NF3 or any combination thereof.

For example, the oxide feature is preferably selectively etched with an oxide etching plasma formed using a gas selected from the group consisting of $C_4F_6$, $C_4F_8$, $CF_4$, or any combination thereof. For example, the nitride feature is preferably selectively etched with a nitride etching plasma formed using a gas selected from the group consisting of $CH_3F$, $CH_2F_2$, $CHF_3$, or any combination thereof.

Figure 3A:
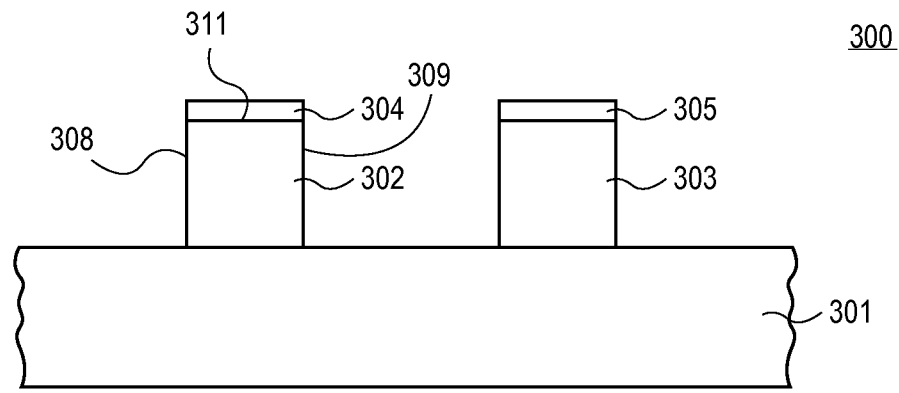
FIG. 3A is a side view of a workpiece to manufacture an electronic device according to yet another embodiment of the invention.

FIG. 3A is a side view of a workpiece 300 to manufacture an electronic device according to yet another embodiment of the invention. Workpiece 300 comprises a substrate 301. In an embodiment, substrate 301 is represented by substrate 101. In an embodiment, substrate 301 comprises a top etch stop layer. The etch stop layer is represented by etch stop layer 202. In an embodiment, the etch stop layer of the substrate 301 is an oxide layer, e.g., silicon oxide, aluminum oxide, silicon oxide nitride, other oxide layer, or any combination thereof. A pattern layer comprising a plurality of features—e.g., a feature 302 and a feature 303 are formed on the etch stop layer of the substrate 301.

Feature 302 has a top portion 311 and opposing sidewalls 308 and 309. In an embodiment, the height of the features 302 and 303 is in an approximate range from about 30 nm to about 500 nm. In an embodiment, the distance between the features 302 and 303 is from about 5 nm to about 100 nm.

In an embodiment, the features 302 and 303 are represented by the features described above. In an embodiment, at least one of the features 302 and 303 acts as a hard mask to the underlying one or more layers of the substrate 301. In an embodiment, at least one of the features 302 and 303 is a fin structure to form one or more electronic devices, e.g., transistor, memories, capacitors, resistors, optoelectronic devices, switches, and any other active and passive electronic devices. In one embodiment, each of the features 302 and 303 comprises one or more semiconductor layers, insulating layers, conductive layers, or any combination thereof, as described above with respect to pattern layer 102. In more specific embodiment, the features 302 and 303 are silicon features formed on the silicon oxide layer of the substrate 301. The features 302 and 303 can be patterned and etched using one or more patterning and etching techniques known to one of ordinary skill in the art of electronic device manufacturing, as described above.

As shown in FIG. 3A, patterned hard mask portions 304 and 305 are deposited on the top portions of the features 302 and 303. The patterned hard mask portions 304 and 305 are formed using one or more patterning and etching techniques known to one of ordinary skill in the art of electronic device manufacturing. The hard mask portions 304 and 305 can be portions of any of the hard mask layers as described above with respect to the hard mask layer 103. In more specific embodiment, the hard mask portions 304 and 305 comprise silicon oxide. In another more specific embodiment, the hard mask portions 304 and 305 comprise silicon nitride.

Figure 3B:
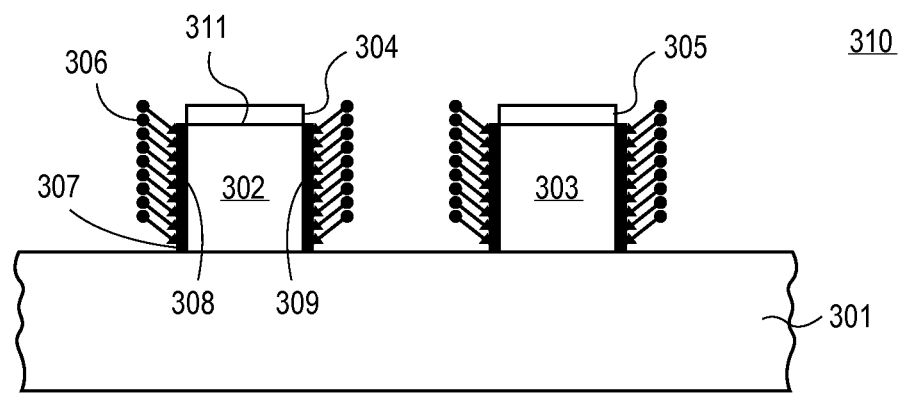
FIG. 3B is a view similar to FIG. 3A illustrating selectively depositing the material layer by an implantation of ion species according to yet another embodiment of the invention.

FIG. 3B is a view 310 similar to FIG. 3A illustrating selectively depositing the material layer by an implantation of ion species according to yet another embodiment of the invention. As shown in FIG. 3B, a material layer 307 is selectively deposited onto the sidewalls of the features 302 and 303 by using the implantation process of ion species 306. The material layer is not grown on the hard mask portions 304 and 305 and the top portions of the substrate 301 outside of the features 302 and 303, so that the hard mask portions and the top portions of the substrate outside of the features remain exposed, as shown in FIG. 3B.

In an embodiment, the sidewalls of the features, such as sidewalls 307 and 308 are subjected to a treatment by the ion species. In one embodiment, the species 306 are implanted to modify the sidewall of the features 302 and 303, so that the material layer 307 is formed. As shown in FIG. 3B, the ion species 306 attach only to the sidewalls of the features 302 and 303. The ion species do not attach to the hard mask portions 304 and 305 and to the substrate 301. As shown in FIG. 3B, the material layer 307 is selectively deposited on sidewalls of the features 302 and 303 while leaving the hard mask portions 304 and 305 and the portions of the substrate 301 outside the features 302 and 303 exposed. In an embodiment, the material layer 307 is different from the material of the features and the material of the substrate. In an embodiment, the material layer 307 has an etch selectivity to the features and to the substrate.

In an embodiment, energy of the ion species, temperature of the ion species, or both are adjusted to control the selective deposition of the layer 307. In an embodiment, a dose of the ion species, a mass of the ion species, or both are adjusted to control the selective deposition of the layer 307, as described above. In an embodiment, ion species 306 are represented by ion species 111. In an embodiment, the ion species 306 comprise carbon, silicon, germanium, or any combination thereof. The thickness of the material layer 307 is determined by an electronic device design. In an embodiment, the material layer 307 is deposited to the thickness from about 2 nm to about 100 nm. In more specific embodiment, the thickness of the material layer 307 is from about 5 nm to about 50 nm.

Figure 3C:
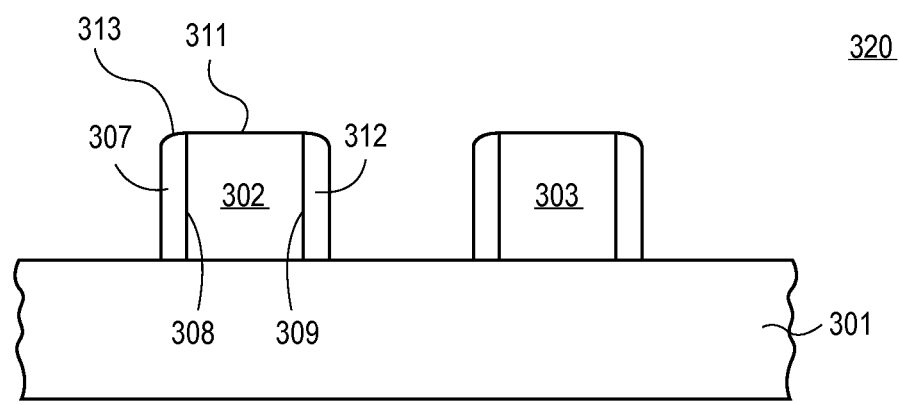
FIG. 3C is a view similar to FIG. 3B after the material layer is deposited and the hard mask portions are removed according to yet another embodiment of the invention.

FIG. 3C is a view 320 similar to FIG. 3B after the material layer 307 is deposited and the hard mask portions are removed according to yet another embodiment of the invention. As shown in FIG. 3C, the material layer 307 is selectively deposited on the sidewalls of the features, so that sidewall spacers, such as sidewall spacers 312 and 313 are formed. As shown in FIG. 3C, the top hard mask portions 304 and 305 are removed to expose the top portions of the features 302 and 303. The hard mask portions 304 and 305 can be removed using one of the hard mask removal techniques known to one of ordinary skill in the art of electronic device manufacturing. Formation of the spacers by selective deposition of the spacer material using an ion implantation process provides an advantage over the standard spacer forming techniques as it eliminates an etching operation, which traditionally follows the deposition to remove the portions of the spacer layer from the substrate.

In an embodiment, the material layer 307 comprises a carbon layer, a silicon layer, a germanium layer, other material layer, or any combination thereof. In another embodiment, the material layer comprises a titanium oxide layer, a titanium nitride layer, an aluminum oxide layer, an aluminum nitride layer, other material layer, any combination thereof.

In a non-limiting example, the material layer 307 is a carbon layer selectively deposited by implantation of carbon ions on the sidewalls of the silicon feature while leaving the substrate of silicon oxide exposed. In another non-limiting example, the material layer 307 is a carbon layer selectively deposited by implantation of carbon ions on the sidewalls of the germanium feature while leaving the substrate of silicon oxide exposed. In another non-limiting example, the material layer 307 is a silicon layer selectively deposited by implantation of silicon ions on the sidewalls of the silicon nitride feature. In yet another non-limiting example, the material layer 307 is a silicon layer selectively deposited by implantation of silicon ions on the sidewalls of the silicon oxide feature. In yet another non-limiting example, the material layer 307 is a germanium layer selectively deposited by implantation of germanium ions on the sidewalls of the germanium nitride feature. In yet another non-limiting example, the material layer 307 is a germanium layer selectively deposited by implantation of germanium ions on the sidewalls of the germanium oxide feature.

Figure 4A:
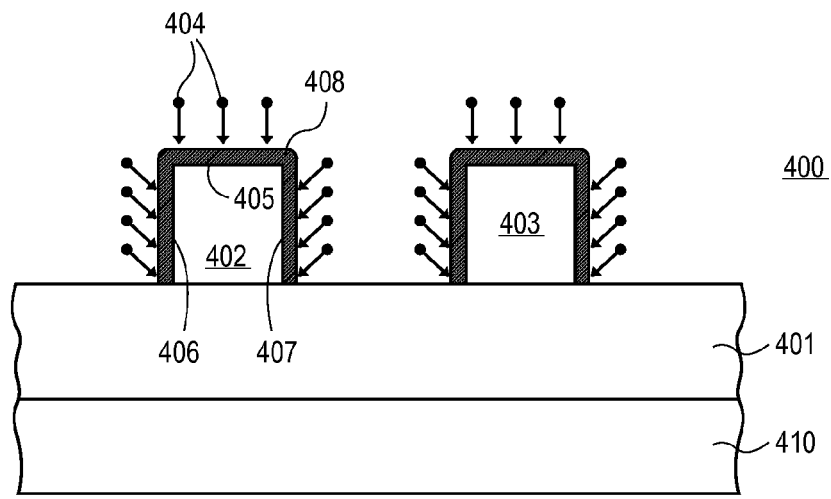
FIG. 4A is a side view of a workpiece to manufacture an electronic device according to yet another embodiment of the invention.

FIG. 4A is a side view of a workpiece 400 to manufacture an electronic device according to yet another embodiment of the invention. A workpiece 400 comprises a pattern layer on an etch stop layer 401 on a substrate 410. The pattern layer comprises a plurality of features—e.g., features 402 and 403—that are formed on an etch stop layer 401 on substrate 410. Substrate 410 is similar to substrate 101. Etch stop layer 401 is similar to etch stop layer 202. Features 402 and 403 are similar to features 302 and 303. Feature 402 has a top portion 405 and opposing sidewalls 406 and 407. As shown in FIG. 4A, a material layer 408 is selectively deposited onto the sidewalls of the features 402 and 403 by the implantation process of ion species 404. The material layer 408 is not grown on the etch stop layer 401, so that the portions of the etch stop layer 401 outside the features remain exposed, as shown in FIG. 4A.

As shown in FIG. 4A, the top portions and sidewalls of the features 402 and 403 are subjected to a treatment by ion species 404. In one embodiment, the species 404 are implanted to modify the top portions and sidewall of the features 402 and 403, so that the material layer 408 is formed. In one embodiment, the ion species 404 attach only to the top portions and sidewalls of the features 402 and 403. The ion species do not attach to the etch stop layer 401. As shown in FIG. 3B, the material layer 408 is selectively deposited on the sidewalls of the features 402 and 403 while leaving the portions of the etch stop layer 401 outside the features 402 and 403 exposed.

In an embodiment, the material layer 408 is different from the material of the features and the material of the etch stop layer. In an embodiment, the material layer 408 has an etch selectivity to the features and to the etch stop layer.

In an embodiment, energy of the ion species, temperature of the ion species, or both are adjusted to control selective deposition of the layer 408. In an embodiment, a dose of the ion species, a mass of the ion species, or both are adjusted to control selective deposition of the layer 408, as described above.

In an embodiment, ion species 404 are similar to ion species 306. In an embodiment, the ion species 404 comprise carbon, silicon, germanium, or any combination thereof.

Figure 4B:
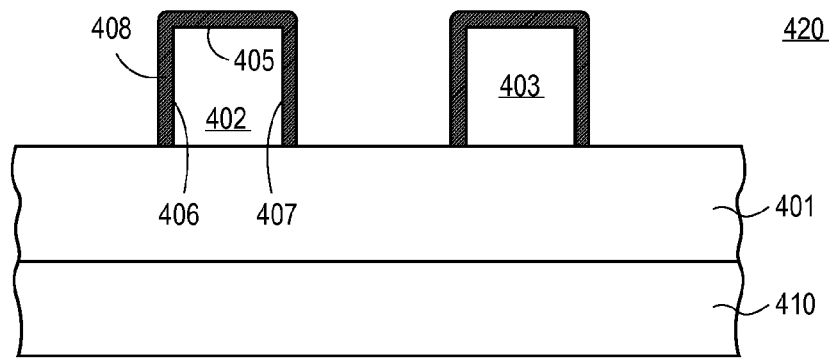
FIG. 4B is a view similar to FIG. 4A after the material layer is deposited according to yet another embodiment of the invention.

FIG. 4B is a view 420 similar to FIG. 4A after the material layer 408 is deposited according to yet another embodiment of the invention. As shown in FIG. 4B, the material layer 408 is selectively deposited on the top portions and sidewalls of the features 402 and 403. The material layer 408 is similar to the material layer 307. In an embodiment, the thickness of the material layer 408 is from about 2 nm to about 100 nm. In more specific embodiment, the thickness of the material layer 408 is from about 5 nm to about 50 nm.

Figure 4C:
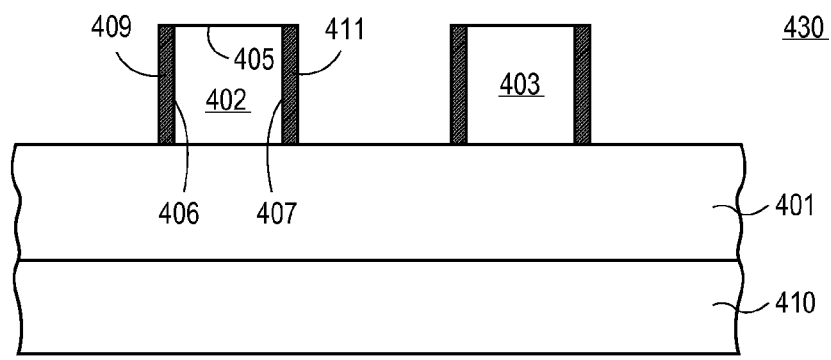
FIG. 4C is a view similar to FIG. 4B after the material layer is removed from the top portions of the features to form sidewall spacers according to yet another embodiment of the invention.

FIG. 4C is a view 430 similar to FIG. 4B after the material layer 408 is removed from the top portions of the features 402 and 403 to form sidewall spacers according to yet another embodiment of the invention. As shown in FIG. 4C, the material layer 408 is removed from the top portions of the features 402 and 403 so that sidewall spacers, such as sidewall spacers 409 and 411 are formed. The material layer 408 can be removed from the top portions of the features 302 and 303 using one or more of the etching and CMP techniques known to one of ordinary skill in the art of electronic device manufacturing.

Figure 5:
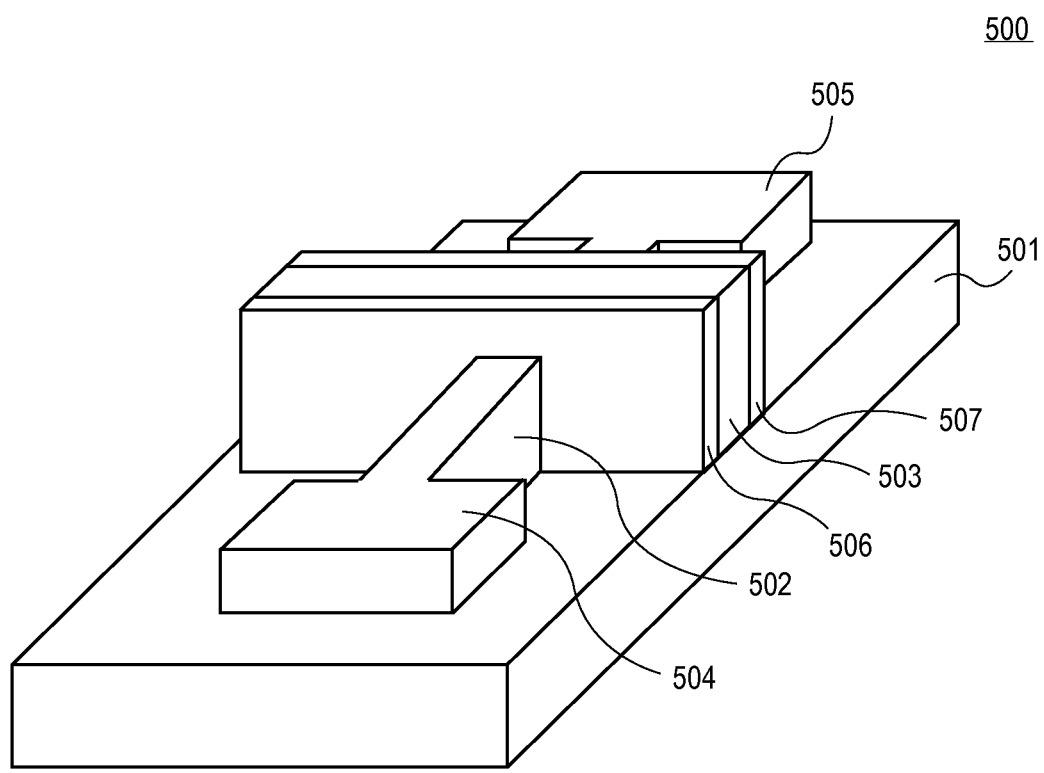
FIG. 5 is a perspective view of a fin structure according to one embodiment of the invention.

FIG. 5 is a perspective view of a fin structure 500 according to one embodiment of the invention. A fin 502 is formed on a substrate 501. The substrate 501 is one of the substrates described above. In an embodiment, fin 502 represents one of the features 121, 122, 302, 303, 402, 403. In an embodiment, fin structure 500 is a part of a tri-gate transistor. In an embodiment, the material layer deposited by implanting ion species is formed adjacent to fin 402 to provide field isolation (e.g., STI) regions that isolate one electronic device from other devices on substrate 501, as described above with respect to FIGS. 1A-1C.

As shown in FIG. 5, the fin 502 protrudes from a top surface of the substrate 501. A gate dielectric layer (not shown) is deposited on the opposing sidewalls and on the top surface of the fin 502. As shown in FIG. 5, a gate electrode 503 is deposited on the gate dielectric layer on the fin 502. Gate electrode 503 is formed on and around the gate dielectric layer on the fin 502 as shown in FIG. 5. A drain region 505 and a source region 504 are formed at opposite sides of the gate electrode 503 in fin 502, as shown in FIG. 5.

In an embodiment, sidewall spacers 506 and 507 are formed on the sidewalls of the gate electrode. Sidewall spacers can be used, for example, to offset heavy source/drain contact implants, to isolate source/drain regions from the gate electrode during a selective silicon deposition process, or can be used in a silicide process to form silicide on the source and drain regions and on the gate electrode. Spacers 506 and 507 can be formed by selectively depositing a spacer material layer on the sidewalls of the gate electrode using an ion implantation, as described above with respect to FIGS. 3A-3C and 4A-4C.

FIG. 6 shows a block diagram of one embodiment of a processing system 600 to deposit a material layer by an ion implantation according to one embodiment of the invention. As shown in FIG. 6, system 600 has a processing chamber 601. A movable pedestal 602 to hold a workpiece 603 is placed in processing chamber 601. Pedestal 602 comprises an electrostatic chuck ("ESC"), a DC electrode embedded into the ESC, and a cooling/heating base. In an embodiment, the ESC comprises an $Al_2O_3$ material, $Y_2O_3$, or other ceramic materials known to one of ordinary skill of electronic device manufacturing. A DC power supply 604 is connected to the DC electrode of the pedestal 602.

As shown in FIG. 6, a workpiece 603 is loaded through an opening 608 and placed on the pedestal 602. In an embodiment, the workpiece comprises a pattern layer over a substrate, as described above. An ion source 613 is coupled to processing chamber 601. System 900 comprises an inlet 611 to receive one or more gases 612 and to supply the one or more gases to ion source 613. Ion source 613 is coupled to a source power 610. Ion source 613 comprises a coil system 625 to generate ion species 615 from the one or more gases and to supply ion species to the workpiece 603, as described above. Ion species 615 are extracted from the plasma and accelerated by an electric field towards the workpiece 603.

In an embodiment, the processing chamber 601 is an inductively coupled plasma ("ICP") chamber. Ion species 615 comprise positive ions, e.g., ionized atoms, ionized molecules, clusters of ions, other ionized particles, or any combination thereof.

As shown in FIG. 6, a pressure control system 609 provides a pressure to processing chamber 601. As shown in FIG. 6, chamber 601 is evacuated via one or more exhaust outlets 616 to evacuate volatile products produced during processing in the chamber. A control system 617 is coupled to the chamber 601. The control system 617 comprises a processor 618, a temperature controller 619 coupled to the processor 618, a memory 620 coupled to the processor 618, and input/output devices 621 coupled to the processor 620. The processor 618 has a first configuration to control depositing a material layer on the pattern layer using an implantation process of the ion species, as described above. The processor 618 has a second configuration to control forming a trench on the pattern layer. The processor 618 has a third configuration to control depositing the material layer into the trench using the ion implantation process, as described above. The processor 618 has a fourth configuration to control selectively depositing the material layer on a sidewall of the feature using the ion implantation process, as described above. The processor 618 has a fifth configuration to control adjusting at least one of an energy and a temperature of the ion species to control the depositing, as described above. The control system 617 is configured to perform methods as described herein and may be either software or hardware or a combination of both. Memory 620 may include a machine-accessible storage medium (or more specifically a computer-readable storage medium) on which is stored one or more sets of instructions (e.g., software) embodying any one or more of the methodologies or functions described herein. The software may also reside, completely or at least partially, within the memory 620 and/or within the processor 618 during execution thereof by the control system 617, the memory 620 and the processor 618 also constituting machine-readable storage media. The software may further be transmitted or received over a network (not shown) via a network interface device (not shown).

The processing system 600 may be any type of high performance semiconductor processing systems known in the art, such as but not limited to an ion implantation system, a plasma system, or any other semiconductor processing system to manufacture electronic devices. In an embodiment, the system 600 may represent one of the implant systems—e.g., P3i, PLAD, Eagle, Trident, other systems—manufactured by Applied Materials, Inc. located in Santa Clara, Calif., or any other species processing system.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an electronic device comprising:
   supplying ion species to a workpiece comprising a pattern layer comprising a trench on a substrate, the trench comprising a bottom, a top, a first sidewall and a second sidewall between the top and the bottom, and a gap between the first sidewall and the second sidewall; and
   filling the gap from the bottom up to the top by a material layer comprising carbon using an implantation process of the ion species.

2. The method of claim 1, wherein the material layer has an etch selectivity to the pattern layer.

3. The method of claim 1, further comprising
   forming the trench on the pattern layer, and
   wherein the material layer is directionally deposited on the bottom of the trench along an axis substantially parallel to the sidewalls.

4. The method of claim 1, wherein the first sidewall is a part of a pattern layer feature, and wherein the method further comprises
   selectively depositing the material layer on the first sidewall of the feature using the ion implantation process.

5. The method of claim 1, wherein the ion species comprise silicon, germanium, or any combination thereof.

6. The method of claim 1, further comprising
   adjusting at least one of an energy and a temperature of the ion species to control the depositing.

7. The method of claim 1, wherein the material layer is selectively deposited on the pattern layer while leaving a third material layer on the pattern layer exposed.

8. A method to manufacture an electronic device comprising:
   supplying ion species to a workpiece comprising a plurality of trenches between a plurality of features on an etch stop layer on a substrate, wherein at least one of the plurality of trenches comprises a bottom, a top, a first sidewall and a second sidewall between the top and the bottom, and a gap between the first sidewall and the second sidewall;
   filling the gap from the bottom up to the top by a material layer comprising carbon using an implantation process of the ion species.

9. The method of claim 8, further comprising
   depositing a patterned mask layer on the material layer; and
   selectively etching at least one of the features.

10. The method of claim 8, wherein at least one of the features comprises a core and a sidewall spacer adjacent to the core.

11. The method of claim 8, wherein at least one of the features comprises a fin structure, wherein the material layer is selectively deposited on the at least one of the features.

12. The method of claim 8, wherein the material layer has an etch selectivity to at least one of the plurality of features.

13. The method of claim 8, wherein the ion species comprise silicon, germanium, or any combination thereof.

14. The method of claim 8, further comprising
   adjusting at least one of an energy and a temperature of the ion species to control the depositing.

* * * * *